United States Patent [19]

Kasagi

[11] Patent Number: 5,672,907
[45] Date of Patent: Sep. 30, 1997

[54] SEMICONDUCTOR DEVICE HAVING CHARACTER IN BPSG FILM

[75] Inventor: Yasuo Kasagi, Tokyo, Japan

[73] Assignee: Nippon Steel Corporation, Tokyo, Japan

[21] Appl. No.: 618,170

[22] Filed: Mar. 19, 1996

[30] Foreign Application Priority Data

Mar. 22, 1995 [JP] Japan .................................. 7-088739

[51] Int. Cl.$^6$ .................................................. H01L 23/58
[52] U.S. Cl. ........................ 257/632; 257/634; 257/635; 257/650
[58] Field of Search ............................. 257/632, 634, 257/635, 650

[56] References Cited

U.S. PATENT DOCUMENTS 5,272,115  12/1993  Sato ..................................... 437/228

FOREIGN PATENT DOCUMENTS 62-48027  3/1987  Japan .
5-13406   1/1993  Japan .

Primary Examiner—Tom Thomas
Assistant Examiner—Roy Potter
Attorney, Agent, or Firm—Pollock, Vande Sande & Priddy

[57] ABSTRACT

A semiconductor device in which the elution quantity of boron and phosphorus from a BPSG film in a process of washing a wafer is controlled low so as to realize sufficient flattening and in which a reflow processing temperature is lowered by increasing concentrations of boron and phosphorus in the BPSG film. A first BPSG film in which the boron concentration is 3.5 wt % to 4.5 wt % and the phosphorus concentration is 5.5 wt % to 6.5 wt % is formed through a polysilicon wiring layer on a semiconductor substrate by a CVD method using an inorganic material source such as $SiH_4$, $B_2H_6$, $PH_3$, $O_2$ or an organic material source such as TEOS, TMOP, TMB, or $O_3$. A gas flow rate is then changed so as to form a second BPSG film having a boron concentration of 2.0 wt % to 3.0 wt % and a phosphorus concentration of 5.5 wt % to 6.5 wt %. Thereafter, the first and the second BPSG films are made floating by reflow processing so as to perform flattening of these films after washing the semiconductor substrate.

24 Claims, 4 Drawing Sheets

SEMICONDUCTOR DEVICE HAVING CHARACTER IN BPSG FILM

FIELD OF THE INVENTION

The present invention relates to a semiconductor device, and more particularly to a semiconductor device applied with a flattening technique using a boron-phosphor silicate glass (BPSG) film.

BACKGROUND OF THE INVENTION

As the integration of a semiconductor device gets higher, flattening of a surface layer thereof has become to be regarded as important in recent years. In order to flatten the difference in level of a foundation film produced by polysilicon endurable during high-temperature heat treatment, a BPSG film is used generally for an interlayer insulation film formed as an upper layer on the foundation film. The BPSG film is an insulation film in which a glass transition temperature is lowered by introducing boron (B) and phosphorus (P) into a $SiO_2$ film, and a floating phenomenon of a film called reflowing is generated by applying heat treatment (reflow treatment) at a temperature of approximately 900° C. to the BPSG film, thus flattening the surface of the film.

As a semiconductor element is made finer, however, an organic contaminant and a metal contaminant that adhere in particular to the back of a wafer (a silicon substrate) thus generating the situation of lowering production yield. Accordingly, a method of washing a wafer after film formation processing of a BPSG film and applying reflow processing after contaminants are removed is being adopted widely.

In JP-A-62-48027 laid open on Mar. 2, 1987, a semiconductor device is disclosed in which an interlayer insulation film is a silicon acid glass film containing phosphorus and boron with concentrations thereof changed continuously in a vertical direction. Namely, the boron concentration is high at the lower part of the BPSG film used as the interlayer insulation film, and the boron concentration is lower and the phosphorus concentration gets higher relatively going toward the upper part. In order to form such a BPSG film, however, the flow rate of $B_2H_6$ has to be changed as the BPSG film is grown in a chemical vapor deposition method using gas containing $B_2H_6$ or the like, thus making the fabrication process very complicated.

Furthermore, in JP-A-5-13406 laid open on Jan. 22, 1993, a BPSG reflow film for LSI elements is disclosed wherein the phosphorus concentration in an upper layer portion of the film is made higher than that of other portions and the boron concentration in a lower layer portion of the film is made higher than that of other portions. According to the disclosed embodiment, the BPSG film has a three-layer structure, in which the boron concentration is 0.2 wt % and the phosphorus concentration is 8.2 wt % in the upper layer portion and the boron concentration is 4.5 wt % and the phosphorus concentration is 0.5 wt % in the lower layer portion. Here, the composition of the BPSG film is obtained based on such simulation that a configuration change occurs by surface diffusion only. According to the composition described above, however, since the phosphorus concentration in the upper layer portion is very high, there is a fear that a large quantity of phosphorus in the upper layer portion is eluted by washing. Further, since the total concentration of boron and phosphorus in the lower layer portion is as low as 5.0 wt % as against the total concentration of boron and phosphorus in the upper layer portion which is 8.4 wt %, the glass transition temperature in the lower layer portion rises considerably as compared with the upper layer portion.

SUMMARY OF THE INVENTION

It is an object of the present invention to provide a semiconductor device capable of realizing sufficient flattening by controlling the elution quantity of boron and phosphorus from a BPSG film at a low level in a washing process of a wafer, and also capable of further lowering a reflow processing temperature by increasing the concentrations of boron and phosphorus in a BPSG film.

In order to achieve the object described above, a semiconductor device according to the present invention includes a first BPSG film formed on a semiconductor substrate through a wiring layer containing approximately 3.5 wt % to 4.5 wt % of boron and a second BPSG film formed on the first BPSG film and having a boron content lower than that of the first BPSG film. Here, the boron content of the second BPSG film may be approximately 2.0 wt % to 3.0 wt %.

Further, the phosphorus contents of the first BPSG film and the second BPSG film may be almost equal to each other. Here, the phosphorus contents of the first BPSG film and the second BPSG film may be approximately 5.5 wt % to 6.5 wt %.

According to the present invention, since the quantity of boron that is eluted from the second BPSG film is reduced by a large margin when a semiconductor substrate is washed, the flowing of the first and the second BPSG films will never be impeded in the reflow processing. Further, since the quantity of boron and phosphorus that are eluted from the first BPSG film when the semiconductor substrate is washed is reduced by a large margin, it is possible to increase the total content of boron and phosphorus of the first BPSG film to a higher level than before. Accordingly, it is possible to lower the glass transition temperature of the first BPSG film sufficiently, thereby lowering the reflow temperature.

DESCRIPTION OF THE PREFERRED EMBODIMENTS

The present invention will be described hereinafter with respect to one embodiment with reference to the drawings.

FIGS. 1A to 1D show sectional views of a semiconductor device of an embodiment in which the present invention is applied to flattening of a polysilicon wiring layer in a fabrication process.

Figure 1A:
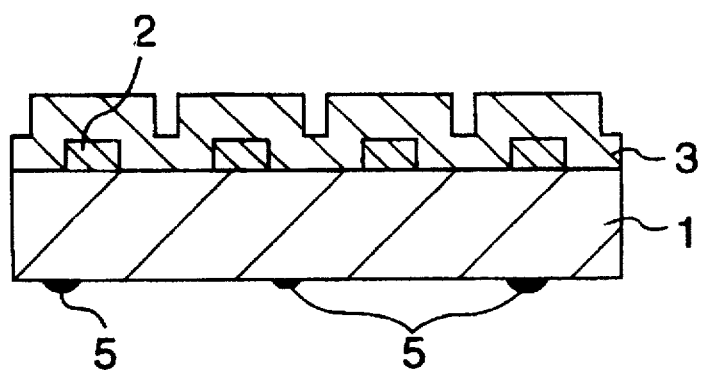
FIGS. 1A to 1D are sectional views showing a method of fabricating a semiconductor device according to one embodiment of the present invention.

First, as shown in FIG. 1A, a first BPSG film 3 having a film thickness of approximately 0.4 μm to 1.0 μm that contains approximately 3.5 wt % to 4.5 wt % of boron and approximately 5.5 wt % to 6.5 wt % of phosphorus is formed on a polysilicon wiring layer 2 having a film thickness of approximately 0.3 μm formed by patterning on a semiconductor substrate 1 such as a silicon substrate. At this time, the first BPSG film 3 is formed by an atmospheric pressure thermal CVD (chemical vapor deposition) method using an inorganic material source such as $SiH_4$, $B_2H_6$, $PH_3$, $O_2$ or an organic material source such as TEOS (tetraethyloxysilane), TMOP (trimethyl phosphate), TMB (trimethyl borate), $O_3$ (ozone), but a low-pressure thermal CVD method or a plasma enhanced CVD method may also be used. Further, in order to prevent the diffusion of boron or phosphorus from the first BPSG film 3, a silicon oxide film or a silicon nitride film having a film thickness of approximately 0.1 μm may also be formed in the lower layer of the first BPSG film 3. Contaminants 5 adhere to the back of the wafer (the silicon substrate) 1 by the formation of the first BPSG film 3.

Figure 1B:
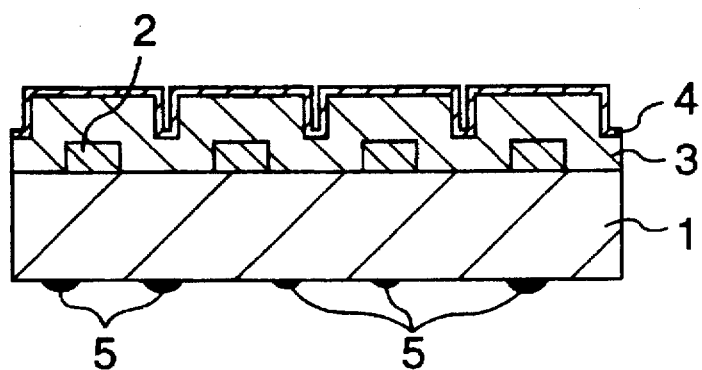

Next, as shown in FIG. 1B, a second BPSG film having a film thickness of approximately 0.05 μm to 0.1 μm having boron and phosphorus concentrations lower than those of the first BPSG film 3 and containing approximately 2.0 wt % to 3.0 wt % of boron and approximately 5.5 wt % to 6.5 wt % of phosphorus is formed on the first BPSG film 3 by an atmospheric pressure thermal CVD method using an inorganic material source such as $SiH_4$, $B_2H_6$, $PH_3$, $O_2$ or an organic material source such as TEOS, TMOP, TMB, $O_3$. The contaminants 5 also adhere to the back of the wafer 1 by the formation of this second BPSG film 4. It is desirable that the second BPSG film 4 is formed successively from the process of forming the first BPSG film 3 by controlling the setting of the gas flow rate, but the film formation may be interrupted once. Further, the second BPSG film 4 may also be formed by a low-pressure thermal CVD method or a plasma enhanced CVD method.

Figure 1C:
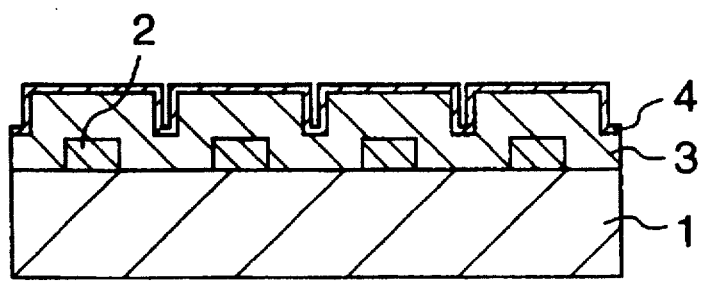

Next, as shown in FIG. 1C, the wafer 1 is washed in a chemical obtained by mixing sulfuric acid with hydrogen peroxide, thereby removing the contaminants 5 that have adhered to the back of the wafer 1. In washing the wafer in the present process, the boron concentration of the second BPSG film 4 is comparatively low. Therefore, the elution quantity of boron and phosphorus from the second BPSG film 4 becomes less by a larger margin than before. The chemical at this time may be a mixed liquid of hydrochloric acid and hydrogen peroxide. However, since the contaminants 5 are diffused in the wafer 1 during the next reflow processing if washing of the wafer 1 is insufficient, it is vital to adopt a method of washing a wafer having sufficient ability to remove the contaminants 5.

Figure 1D:
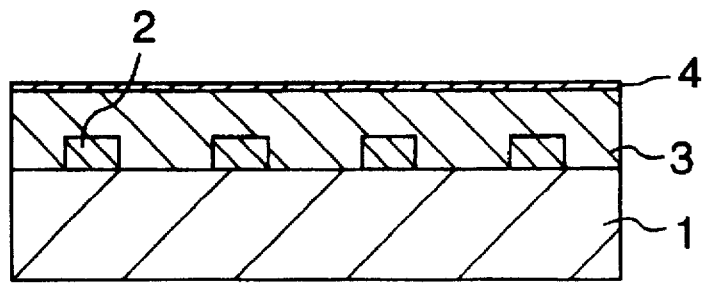

Next, as shown in FIG. 1D, the reflow processing is performed for the processing period of 30 minutes at a temperature of 850° C. to 950° C. in a nitrogen atmosphere so as to make the first and the second BPSG films 3 and 4 float, thereby flattening the surface of the wafer 1. When a silicon nitride film is formed in the lower layer of the first BPSG film 3, the reflow processing may be performed in a water vapor atmosphere in place of the nitrogen atmosphere.

Next, the reason why compositions of the first and the second BPSG films have been selected as described above will now be explained.

Figure 2:
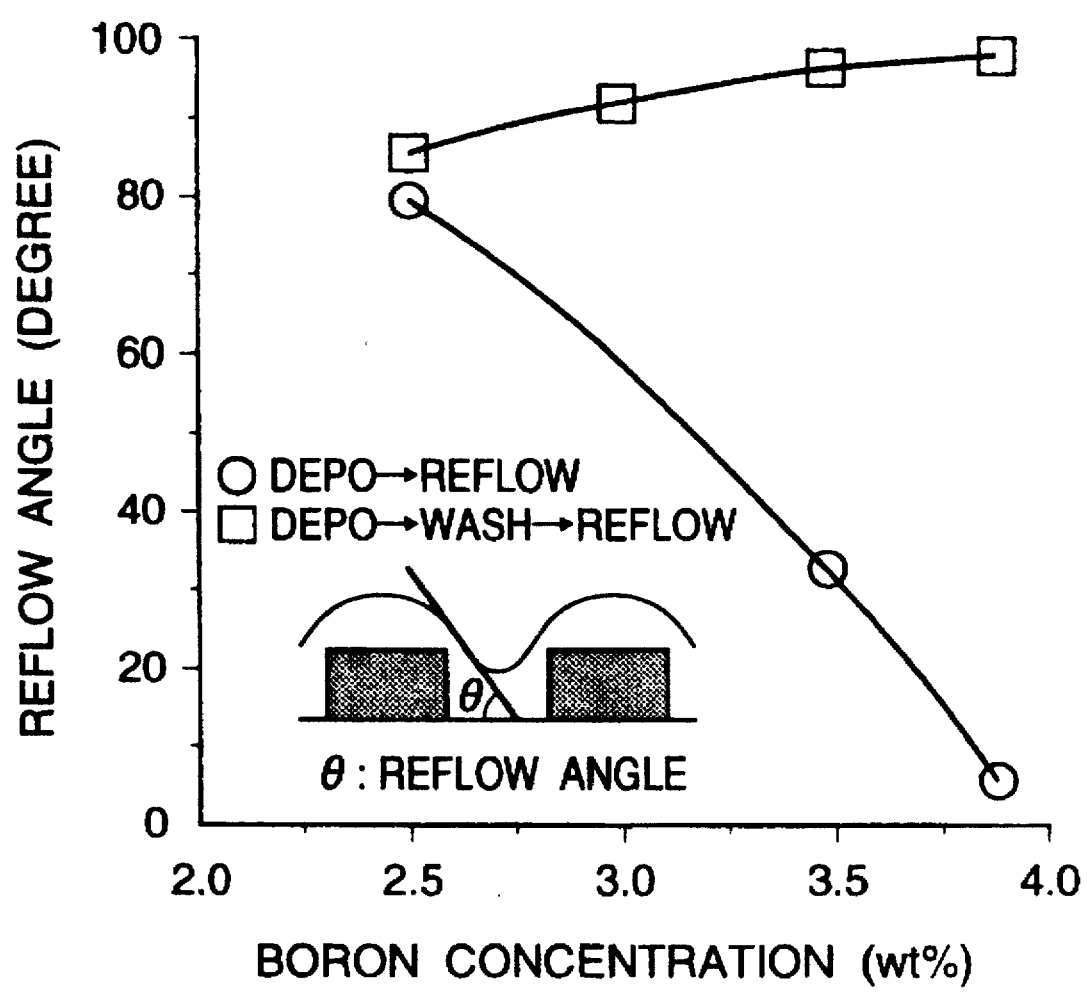
FIG. 2 is a diagram showing the result of measurement in which boron concentration dependencies of a reflow configuration of a single BPSG film before and after washing with sulfuric acid are compared with each other.

FIG. 2 shows the result of measurement in which boron concentration dependencies in a reflow configuration of a single BPSG film having a film thickness of 600 nm formed on the wafer are compared by the existence of washing with sulfuric acid. A boron concentration of the BPSG film is plotted along the horizontal axis, and a reflow angle (the maximum inclination) θ of the BPSG film is plotted along the vertical axis. The reflow processing has been performed at a temperature of 600° C. for 60 minutes in a dry atmosphere where nitrogen is flown at a rate of 20 l/min. The phosphorus concentration of the BPSG film is fixed at 6.2 wt %, but this is because it is deemed desirable not to lower the phosphorus concentration below a certain value since phosphorus has a gettering ability of preventing dispersion of ions and that the ability is to be almost saturated when the phosphorus concentration reaches approximately 6 wt %.

The reflow angle indicates that the surface of the film is flattened more as it gets smaller. Since the first BPSG film that becomes the lower layer is scarcely affected by washing, its reflow shape may be considered similarly to that in the case when washing with sulfuric acid is not performed. When it is aimed to make the reflow angle 30° or less, it is required that the boron concentration of the first BPSG film be approximately 3.5 wt % or more, and the boron concentration up to approximately 4.5 wt %, at which the improvement effect of the reflow configuration is saturated, is suitable. This results from the fact that since boron has a higher effect of improving the flow configuration than phosphorus, it is more desirable to fix phosphorus at the concentration described above and increase the boron concentration.

On the other hand, it is comprehended that the reflow configuration deteriorates as the boron concentration becomes higher when washing with sulfuric acid is performed. If the boron concentration is approximately 2.5 wt %, the difference between before and after washing is hardly noticed. Accordingly, it is considered that approximately 2.5 wt %, in specific terms, about 2.0 wt % to about 3.0 wt % is suitable for the boron concentration of the second BPSG film that forms the upper layer, taking the reflow configuration and the glass transition temperature into consideration. It is particularly important to set the concentrations of boron and phosphorus in the second BPSG film which constitutes the upper layer and, at a concentration lower than the above, it is impossible to lower the reflow processing temperature sufficiently, and in addition, impossible to make the BPSG film float by the reflow processing so as to flatten the BPSG film sufficiently. On the other hand, at a concentration higher than the above, boron and phosphorus are eluted from the surface layer of the BPSG film when the wafer is washed, and the reflow configuration is deteriorated.

Figure 3A:
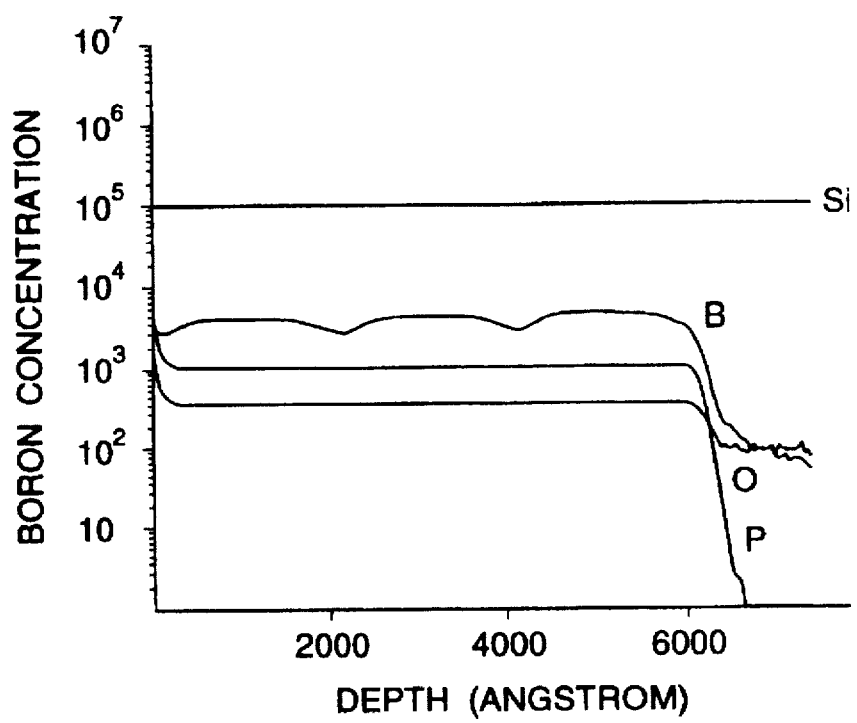
FIGS. 3A and 3B are diagrams showing the results of measurement in which the concentrations of boron and phosphorus in a single BPSG film of low boron concentration before and after washing with sulfuric acid are compared with each other.
Figure 3B:
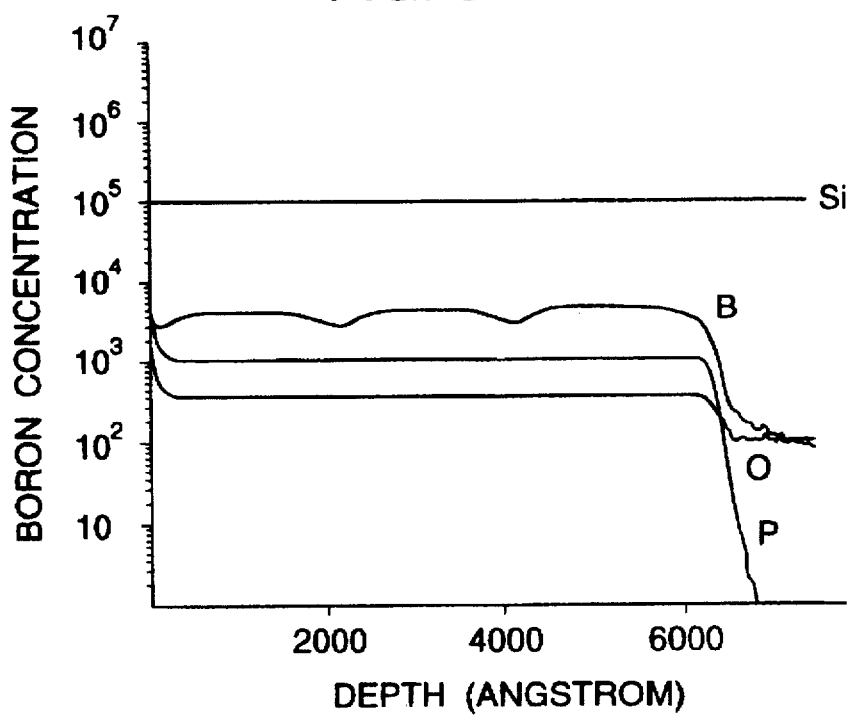

FIG. 3A and FIG. 3B show the results of measurement in which concentration distributions of boron and phosphorus in a single BPSG film of low boron concentration before and after washing with sulfuric acid are compared with each other. The depth in the BPSG film is plotted along the horizontal axis, and the boron concentration value standardized with silicon ionic strength is plotted along the vertical axis. The measurement has been made by secondary ion mass spectrometry (SIMS) using oxygen ions accelerated with voltage at 12.5 KV as primary ions, with an ion current at 30 nA and a beam diameter at 60 μm. The boron concentration at the time of film formation is 2.5 wt %, and the phosphorus concentration is 6.2 wt %. FIG. 3A shows the concentration distribution before washing and FIG. 3B shows that after washing, but almost no change is noticed in the concentration distribution.

Figure 4A:
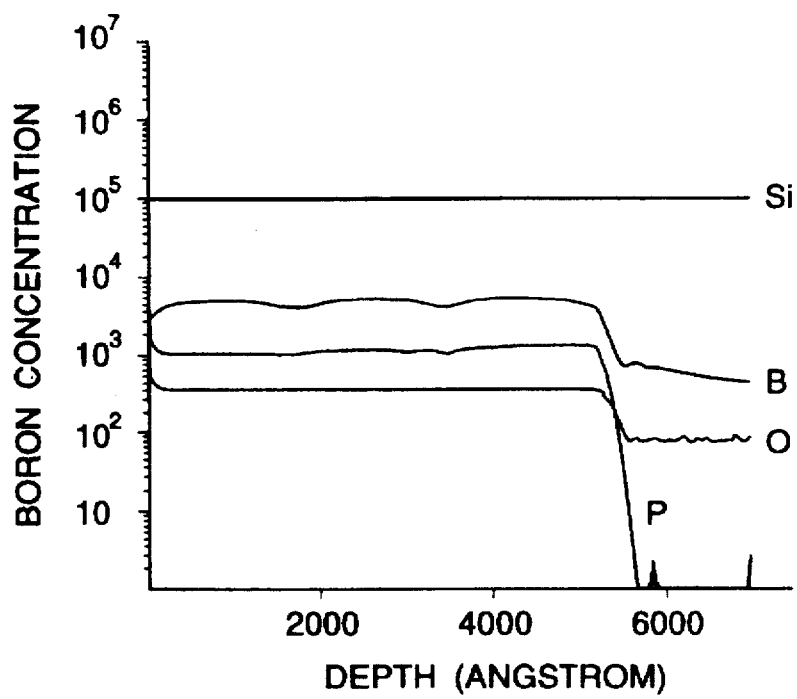
FIGS. 4A and 4B are diagrams showing the results of measurement in which the concentration distributions of boron and phosphorus in a single BPSG film of high boron concentration before and after washing with sulfuric acid are compared with each other.
Figure 4B:
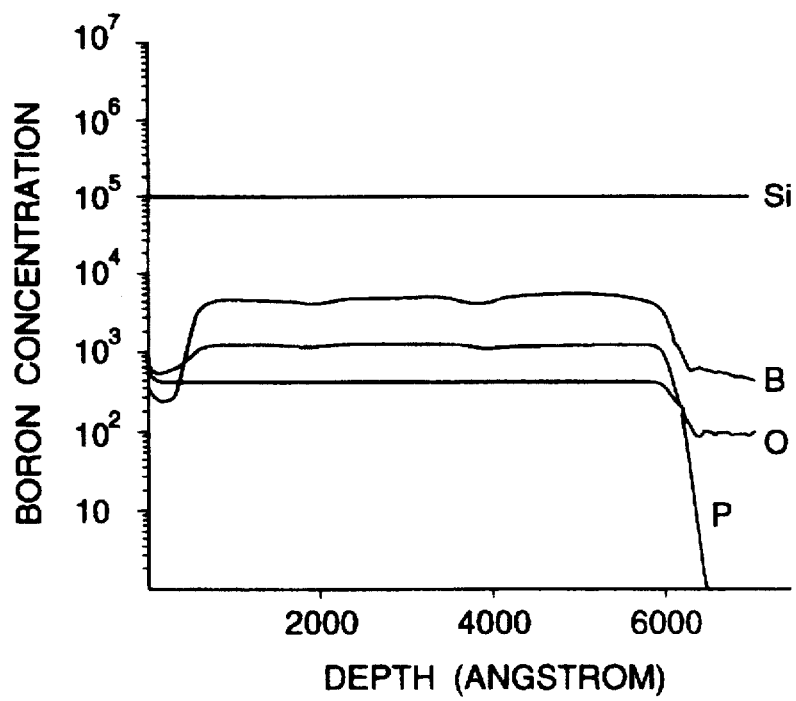

On the other hand, FIGS. 4A and 4B show the results of measurement in which concentration distributions of boron and phosphorus in a single BPSG film of high boron concentration before and after washing with sulfuric acid are compared with each other. The conditions are the same as those in FIGS. 3A and 3B, except that the boron concentration at the time of film formation is 3.9 wt %. FIG. 4A shows the concentration distribution before washing and FIG. 4B shows the concentration distribution after washing, with the boron concentration having dropped to approximately 10% and the phosphorus concentration having dropped to approximately 50% in the surface layer of the BPSG film by washing with sulfuric acid. This shows that boron and phosphorus are eluted by washing with sulfuric acid.

It is considered from the results of measurement shown in FIGS. 3A, 3B, 4A and 4B that elution of boron and phosphorus is hardly generated when the boron concentration of the second BPSG film that becomes the upper layer is approximately 2.5 wt %, in specific terms, about 2.0 wt % to about 3.0 wt %, and the phosphorus concentration is approximately 6 wt %, in concrete terms, about 5.5 wt % to about 6.5 wt %.

As described above, according to the present invention, the first BPSG film having comparatively high boron concentration is protected with the second BPSG film having comparatively low boron concentration. Therefore, elution of boron and phosphorus from the first and the second BPSG films scarcely occurs in the washing process of the semiconductor substrate, but the floating of the first and the second BPSG films will never be impeded in the reflow processing. Further, since the quantities of boron and phosphorus that elute from the first BPSG film are reduced by a large margin, it is possible to increase the concentrations of boron and phosphorus in the first BPSG film. Thus, the glass transition temperature drops, and the configurations of the first and the second BPSG films can be flattened easily by the reflow processing at a low temperature.

Further, since the second BPSG film can be formed continuously from the first BPSG film only by changing the setting of the gas flow rate, no influence is exerted at all on the throughput and the number of processes. Furthermore, since the difference in the film quality between the first and the second BPSG films is small, it is not necessary to alter the process conditions in an afterprocess such as etching.

I claim:

1. A semiconductor device comprising:
    a first BPSG film formed above a semiconductor substrate containing phosphorus and approximately 3.5 wt % to 4.5 wt % of boron; and
    a second BPSG film formed on said first BPSG film, said second BPSG film having a boron content lower than that of said first BPSG film and having a phosphorus content approximately equal to that of the first BPSG film.

2. A semiconductor device according to claim 1, wherein the boron content of said second BPSG film is approximately 2.0 wt % to 3.0 wt %.

3. A semiconductor device according to claim 1, wherein the phosphorus content in said first BPSG film and said second BPSG film is approximately 5.5 wt % to 6.5 wt %.

4. A semiconductor device according to claim 1, wherein a film thickness of said first BPSG film is 4 to 20 times as thick as a film thickness of said second BPSG film.

5. A semiconductor device according to claim 4, wherein the film thickness of said first BPSG film is approximately 0.4 µm to 1.0 µm, and the film thickness of said second BPSG film is approximately 0.05 µm to 0.1 µm.

6. A semiconductor device according to claim 1, further comprising one of a silicon oxide film and a silicon nitride film above said semiconductor substrate and under said first BPSG film.

7. A semiconductor device according to claim 6, wherein a film thickness of one of said silicon oxide film or said silicon nitride film is approximately 0.1 µm.

8. A semiconductor device comprising:
    a first BPSG film formed alone a semiconductor substrate and containing approximately 3.5 wt % to 4.5 wt % of boron and approximately 5.5 wt % to 6.5 wt % of phosphorus; and
    a second BPSG film formed on said first BPSG film and containing approximately 2.0 wt % to 3.0 wt % of boron and approximately 5.5 wt % to 6.5 wt % of phosphorus.

9. A semiconductor device according to claim 8, wherein a film thickness of said first BPSG film is 4 to 20 times as thick as a film thickness of said second BPSG film.

10. A semiconductor device according to claim 9, wherein the film thickness of said first BPSG film is approximately 0.4 µm to 1.0 µm, and the film thickness of said second BPSG film is approximately 0.05 µm to 0.1 µm.

11. A semiconductor device according to claim 8, further comprising one of a silicon oxide film and a silicon nitride film above said semiconductor substrate and under said first BPSG film.

12. A semiconductor device according to claim 11, wherein a film thickness of one of said silicon oxide film or said silicon nitride film is approximately 0.1 µm.

13. A semiconductor device according to claim 8 wherein said first BPSG film is formed through a wiring layer.

14. A semiconductor device comprising:
    a first BPSG film formed above a semiconductor substrate and containing approximately 3.5 wt % to 4.5 wt % of boron and phosphorus in a quantity slightly more than said boron; and
    a second BPSG film formed on said first BPSG film, in which the boron content is lower than that of said first BPSG film and the phosphorus content is almost equal to that of said first BPSG film.

15. A semiconductor device according to claim 14, wherein said first BPSG film and said second BPSG film both contain approximately 5.5 wt % to 6.5 wt % of phosphorus.

16. A semiconductor device according to claim 14, wherein said second BPSG film contains approximately 2.0 wt % to 3.0 wt % of boron.

17. A semiconductor device according to claim 14, wherein a film thickness of said first BPSG film is 4 to 20 times as thick as a film thickness of said second BPSG film.

18. A semiconductor device according to claim 17, wherein the film thickness of said first BPSG film is approximately 0.4 µm to 1.0 µm, and the film thickness of said second BPSG film is approximately 0.05 µm to 0.1 µm.

19. A semiconductor device according to claim 14, further comprising one of a silicon oxide film and a silicon nitride film above said semiconductor substrate and under said first BPSG film.

20. A semiconductor device according to claim 19, wherein a film thickness of one of said silicon oxide film or said silicon nitride film is approximately 0.1 µm.

21. A semiconductor device comprising:
    a first insulating film formed above a semiconductor substrate, said first insulating film containing approximately 3.5 wt % to 4.5 wt % of boron and approximately 5.5 wt % to 6.5 wt % of phosphorus and having a thickness of approximately 0.4 µm to 1.0 µm; and
    a second insulating film formed on said first insulating film, said second insulating film containing approximately 2.0 wt % to 3.0 wt % of boron and approximately 5.5 wt % to 6.5 wt % of phosphorus and having a thickness of approximately 0.05 μm to 0.1 μm.

22. A semiconductor device according to claim 21, further comprising a third insulating film formed under said first insulating film and including one of oxide and nitride.

23. A semiconductor device comprising:

a first insulating film formed above a semiconductor substrate and including one of oxide and nitride;

a second insulating film formed on said first insulating film and containing approximately 3.5 wt % to 4.5 wt % of boron and approximately 5.5 wt % to 6.5 wt % of phosphorus; and a third insulating film formed on said second insulating film and containing approximately 2.0 wt % to 3.0 wt % of boron and approximately 5.5 wt % to 6.5 wt % of phosphorus.

24. A semiconductor device according to claim 23, wherein:

said second insulating film has a thickness of approximately 0.4 μm to 0.1 μm; and said third insulating film has a thickness of approximately 0.05 μm to 0.1 μm.

* * * * *